United States Patent
Thoma et al.

[19]
[11] Patent Number: 6,057,550
[45] Date of Patent: *May 2, 2000

[54] INFRARED OBJECTIVE

[75] Inventors: Christoph Thoma, Unterschleissheim; Matthias Erdmann, Munich; Johann Schweiger, Freising; Karl Pietzsch, Geretsried, all of Germany

[73] Assignee: Steinheil Optronik GmbH, Ismaning, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/658,403

[22] Filed: Jun. 5, 1996

Related U.S. Application Data

[63] Continuation of application No. 08/313,245, filed as application No. PCT/EP94/00322, Feb. 4, 1994, abandoned.

[30] Foreign Application Priority Data

Feb. 4, 1993 [DE] Germany ................ 43 03 231

[51] Int. Cl.[7] ........................................ G01J 5/06
[52] U.S. Cl. ............................................ 250/352
[58] Field of Search .................... 250/352, 332, 250/370.15

[56] References Cited

U.S. PATENT DOCUMENTS

| | | | |
|---|---|---|---|
| 4,775,792 | 10/1988 | Prost | 250/352 |
| 4,783,593 | 11/1988 | Noble | 250/352 |
| 4,820,923 | 4/1989 | Wellman | 250/352 |

FOREIGN PATENT DOCUMENTS

| | | | |
|---|---|---|---|
| 0044791 | 1/1982 | European Pat. Off. | |
| 300130 | 1/1989 | European Pat. Off. | 250/352 |
| 0403880 | 12/1990 | European Pat. Off. | |
| 3716358 | 12/1988 | Germany. | |
| 61-76923 | 4/1986 | Japan | 250/352 |
| 1-299421 | 12/1989 | Japan | 250/352 |
| 3-191835 | 8/1991 | Japan | 250/352 |

*Primary Examiner*—Constantine Hannaher
*Attorney, Agent, or Firm*—Kanesaka & Takeuchi

[57] ABSTRACT

An infrared radiation detector device has a cooled detector element (3) within a first optical device (internal cold shield ($1_i$)). The first optical device includes a first diaphragm ($6_i$) in front of said detector element. The infrared radiation detector device has a second optical device (external cold shield ($1_a$)) which is thermally separated from the first optical device. The second optical device includes a second diaphragm ($6_a$). The aperture ($7_a$) of the diaphragm forms the pupil of the infrared optic which produces an infrared image on the surface of said detector element (3).

14 Claims, 3 Drawing Sheets

INFRARED OBJECTIVE

This is a continuation of application Ser. No. 08/313,245 filed Oct. 3, 1994, now abandoned, which is a 371 of PCT/EP94/00322, filed Feb. 4, 1994.

BACKGROUND OF THE INVENTION

The invention relates to an infrared objective.

The German patent publication 3,716,358 (corresponding to the European patent publication 0 290 751 A2) discloses an infrared radiation device which possesses a cooled Dewar vessel, which includes a sheet-like infrared receiver or detector element, preferably in the form of a focal plane array (FPA) and which is shut off from the infrared optical system by an infrared window transparent to infrared radiation. The Dewar vessel comprises a housing connected with a source of vacuum, and which is shut off from the outside by the infrared window. Inside the housing, opposite to the infrared window an internal cold shield is connected with a cooling device and comprises an internal cold diaphragm and whose cooled bottom wall serves as a support for the focal plane array. Optically in front of the Dewar vessel there is an external cold shield, which is thermally separated from the cooling device and which is so designed and so arranged in relation to the internal cold shield that the aperture of the internal cold diaphragm is projected onto itself by the external cold shield. In this arrangement the external cold shield is for example designed in the form of an internally coated concave mirror with an aperture constituting an external cold diaphragm, the center of curvature coinciding with the center of the internal cold diaphragm. This prior art however does not provide any complete teaching indicating simple means for the cooling effect to be provided for the internal cold shield so that less complicated equipment is required.

The known cold shield is referenced 1 in the diagrammatic FIG. 1a of the accompanying drawing omitting the Dewar vessel and the external cold shield. The cooled bottom wall 2 serving as a support for the detector element 3 is adjoined by side walls 4 and 5, which may be cooled. The cooling device is not illustrated either. At a distance $z_o$ from the image plane adjacent to the surface of the detector element 3 the internal cold diaphragm 6 is located having a central aperture 7. The cold diaphragm 6 adjoins the cooled side walls 4 and 5 and may also be cooled. The aperture 7 of the cold diaphragm possesses a predetermined marginal height $h_0$ above the optic axis x. The cooled bottom wall 2 with the adjoining side walls 4 and 5 and the cold diaphragm 6 located between the same constitute the cooled cold shield 1 within a Dewar vessel, which is not illustrated and is connected with a vacuum device. The aperture ratio $k_0$ of the cold diaphragm is defined as $z_0/2h_0$, $z_0$ being the distance of the aperture 7 of the cold diaphragm 6 from the image plane and $h_0$ being the marginal height of the cold diaphragm. The image height $y_0$ on the surface of the detector element 3 is ±d at the most. The internal cold diaphragm 6 in this respect constitutes the aperture diaphragm and constitutes the exit pupil of the infrared optical system, which is not illustrated. The external cold shield in accordance with the initially mentioned prior art is not illustrated in FIG. 1a either, since it has no effect on the spatial arrangement of the Dewar vessel and, respectively, of the internal cold shield.

Conventional sheet-like detector elements in known cold shields operate with a cold diaphragm aperture ratio $z_0/2h_0$ of 1 to 3.

In order to be able to design the input infrared system with a minimum optical aperture (minimum optical complexity, minimum aberration) in the case of normal prior art arrangements (FIG. 1a) a relatively large distance $z_0$ between the image plane on the surface of the sheet-like detector element 3 and the internal cold diaphragm 6 must be selected, such cold diaphragm 6 constituting the aperture diaphragm, and the exit pupil of the infrared optical system, for the shorter the distance $z_0$ between the image plane on the surface of the sheet-like detector element 3 and the internal cold diaphragm 6 is, the larger the angle $\theta_{d(max)}$ between the ray sheaf of the marginal points of the detector element and the optic axis. This leads to disadvantages as regards weight, volume and price owing to the large lens diameters of the infrared optical system. In the case of a minimum optical aperture of the infrared optical system in practice with an optimum angle $\theta_{opt}$ the minimum distance between the image plane and the cold diaphragm is hence equal to about twice the diagonal diameter of the focal plane array or detector element, if vignetting of the optical system or a poor internal efficiency of the cold shield is to be avoided. In the case of modern large area infrared detector elements this leads to a correspondingly large volume of the internal cold shield or, respectively, to a correspondingly large Dewar vessel. The cooling effect to be provided by the cooling device connected with the internal cold shield is accordingly substantial.

SUMMARY OF THE INVENTION

One object of the invention is therefore to provide a simply designed infrared radiation detector device of the type initially mentioned for an input infrared optical system with a minimum optical aperture in the case of an optical aperture ratio $k_{opt}$ of $\frac{1}{2}\cot(\theta_{d(max)})$, wherein while having a large diameter of the sheet-like detector element and at the same time a comparatively small, simple Dewar vessel with a non-vignetting ray entry opening is made possible which is substantially shorter along the optic axis than in the prior art so that the complexity entailed by the cooling action to be provided may be reduced to a substantially lower level. In this respect the possibility is also to be opened up of arranging the internal cold shield externally of the detector element according to which a greater degree of flexibility of the detector and cold shield system is achieved than is possible in the prior art.

The above mentioned object of the invention is to be attained with the features of the invention. Advantageous embodiments of the invention will be seen from the specification and the claims. Such features provide the man in the art with general rules for designing non-vignetting cold shield systems with a high cold shield efficiency also opening up the possibility of simple upgrading of existing equipment to receive profit from the advantages of the present invention with little complexity only. In comparison with the relevant prior art it is in accordance with the invention possible, while leaving the optical parameters unchanged, to substantially reduce the distance of the internal cold shield in relation to the focal plane detector array or sheet-like detector element, for example to ⅔ of the distance or less, which is employed in the prior art.

The requirement for non-vignetting optics and simultaneously a high efficiency of the cold shield is achieved in accordance with the invention by conditions, which will be explained below with reference to the sketch of FIG. 1b of the drawings.

In FIGS. 1a and 1b like parts are denoted by like reference numerals. In this respect the sketches of FIGS. 1a and 1b are presented one on top of the other in mutual alignment and on the same scale in order in this manner to facilitate a comparison between the invention (FIG. 1b) and the prior art (FIG. 1a).

Unlike the prior art in accordance with FIG. 1a in FIG. 1b the internal cold shield $1_i$ having an internal cold diaphragm $6_i$ constituting the aperture diaphragm and a cold diaphragm aperture $7_i$ is preceded by an external cold shield $1_a$, which in the present case consists of an external cold diaphragm $6_a$ with an aperture $7_a$ and a cold diaphragm aperture ratio of $z_a/2h_a$, which is the same as the cold diaphragm ratio of $z_0/2h_0$ in FIG. 1a, $z_a$ being the distance of the aperture $7_a$ of the external cold shield 1a from the image plane and $h_a$ being the marginal height of the external cold diaphragm aperture $7_a$. The external cold diaphragm $6_a$, which in accordance with the invention constitutes the aperture diaphragm, is in the present example designed in the form of an internally coated concave mirror. The cold diaphragm ratio of the internal cold diaphragm $6_i$ of the internal cold shield 1i is set by the ratio $z_i/2h_i$, $z_i$ being the distance of the aperture $7_i$ of the internal cold diaphragm $6_i$ from the image plane and $h_i$ being the marginal height of the internal cold diaphragm aperture $7_i$. As in FIG. 1a the image height $y_0$ in the detector plane is ±d at the most (the maximum overall diameter of the detector element amounting to 2d) and in the case of a minimum optical aperture of the preceding optical system the aperture ratio ($k_{opt}$) of the optical system is ½cot($\theta_{0(max)}$). For the sake of better intelligibility the ratios in the two systems of FIGS. 1a and 1b are so selected that the angles $\theta_{0(max)}$ are of equal size.

In order to further make the invention clear in FIGS. 1a and 1b the distance of the aperture diaphragm (in FIG. 1a, the internal cold diaphragm 6 and in FIG. 1b, the external cold diaphragm $6_a$) from the image plane is illustrated as being of the same size, that is to say $z_0=z_a$.

The parameters employed in the ensuing calculations for a device in accordance with the invention will now be presented once again in the form of a list:

$\theta$ angle between the marginal rays of ray sheafs of points of the detector element and the optic axis.

$\theta_0$ angle $\theta$ of the image center $\theta_{o(max)}$ the maximum angle $\theta_0$ $\theta_d$ angle $\theta$ of the top of the detector element $\theta_{d(max)}$ the maximum angle $\theta_d$ $k_{opt}$ aperture ratio of the optics ½cot($\theta_{d(max)}$)

$k_a$ external cold diaphragm aperture ratio $z_a/2h_a$.

$k_i$ internal cold shield aperture ratio $z_i/2h_i$.

$z_a$ distance between image plane and external cold diaphragm aperture $7_a$.

$z_i$ distance between image plane and internal cold diaphragm aperture $7_i$.

$y_0$ image height in the detector plane (maximum in the image height=±d)

$h_a$ marginal height of the external cold diaphragm aperture $7_a$.

$h_i$ marginal height of the internal cold diaphragm aperture $7_i$.

NA numerical aperture.

For the image forming marginal rays of the image center (both under $\theta_0$) the following straight ray equation applies:

$$g_0(x) = \pm \frac{h_a}{z_a} x \quad (1)$$

and furthermore the following applies:

NA=sin $\theta_0$ and $$NA = \sin\theta_0 \quad \text{and}$$

$$k_a := \frac{z_a}{2h_a}\left(\frac{1}{2\tan\theta_0}\right)$$

g(x) is the function of "x" wherein "x" is a point of the optic axis "X";

$g_0(x)$ is the function value in the center of the detector element;

$g_d(x)$ is the function value of the top of the detector elements.

For the marginal rays at the image edge (maximum image height, maximum ray sheaf) the following equation in the form of a straight ray equation) will be seen to apply:

$$g_d(x) = -\frac{d \pm h_a}{z_a} x + d \quad (2)$$

In this case as well the first condition $(d+h_a)_{max}$ may be seen to denote the angle $\theta_{d(max)}$ and the second condition $(d-h_a)$ denotes the marginal condition for $h_i$.

As regards the first condition:

$$k_{opt} = \frac{1}{2\tan\theta_{0(max)}} = \frac{z_a}{2(d+h_a)} \quad \text{or} \quad \frac{1}{k_{opt}} = \frac{2d}{z_a} + 2\frac{h_a}{z_a}$$

Since $$\frac{2h_a}{z_a} = \frac{1}{k_a}$$

it will follow that $$\frac{1}{k_{opt}} = \frac{2d}{z_a} + \frac{1}{k_a}$$

as regards the second condition: (determination of internal cold shield)

$$g_d(x) = -\frac{d - h_a}{z_a} x + d$$

With the requirement for freedom from vignetting the following apply (symmetrically in relation to the optic axis):

$$h_i \geq g_d(x = z_i) \quad (3)$$

$$h_i \geq -\frac{d-h_a}{z_a} z_i + d$$

$$h_i \geq +d - \frac{z_i}{z_a}d + h_a\frac{z_i}{z_a} \quad \text{and}$$

$$h_i \geq d\left(1 - \frac{z_i}{z_a}\right) + h_a\frac{z_i}{z_a}$$

For the required aperture ratio of the optics at the input end the following will apply as already stated:

$$\frac{1}{k_{opt}} = \frac{2d}{z_a} + \frac{1}{k_a} \quad (4)$$

The following equations (5) describe the interconnection between an optimum minimum possible (most effective) internal cold shield aperture ratio $k_i$ and the optimum minimum possible distance $z_i$ between the image plane (detector surface or area) and the internal cold diaphragm $6_i$ at a maximum image height ($y_0=d$) of d in the detector plane and with a maximum aperture ratio $k_a$ of the external cold diaphragm, which constitutes the outlet pupil for the optics at the input end $$\frac{1}{2k_i} \geq \frac{1}{2k_a} + \left(\frac{1}{z_i} - \frac{1}{z_a}\right)d \quad (5)$$

This follows from $$\frac{h_i}{z_i} \geq d\left(\frac{1}{z_i} - \frac{1}{z_a}\right) + \frac{h_a}{z_a}$$

in the case of which $$\frac{h_i}{z_i} = \frac{1}{2k_i} \quad \text{and} \quad \frac{h_a}{z_a} = \frac{1}{2k_a}$$

The marginal conditions for the distances $z_a$ in $z_i$ are determined by the following equation:

$$z_i \geq \frac{z_a}{2} \quad (6)$$

For the comparison of the two sketches (FIG. 1a showing the prior art and FIG. 1b showing the invention) $z_a=z_0$, $h_a=h_0$, $h_i=h_0$ and $$z_i \sim \frac{1}{2}z_0.$$

BRIEF DESCRIPTION OF THE DRAWINGS

The invention will be understood from the following detailed descriptive disclosure of embodiments diagrammatically shown in the accompanying drawings.

FIG. 1b is a diagrammatic sketch as mentioned above of a cold shield arrangement in accordance with the invention designed for comparison with FIG. 1a.

DESCRIPTION OF THE PREFERRED EMBODIMENTS

Figure 1A:
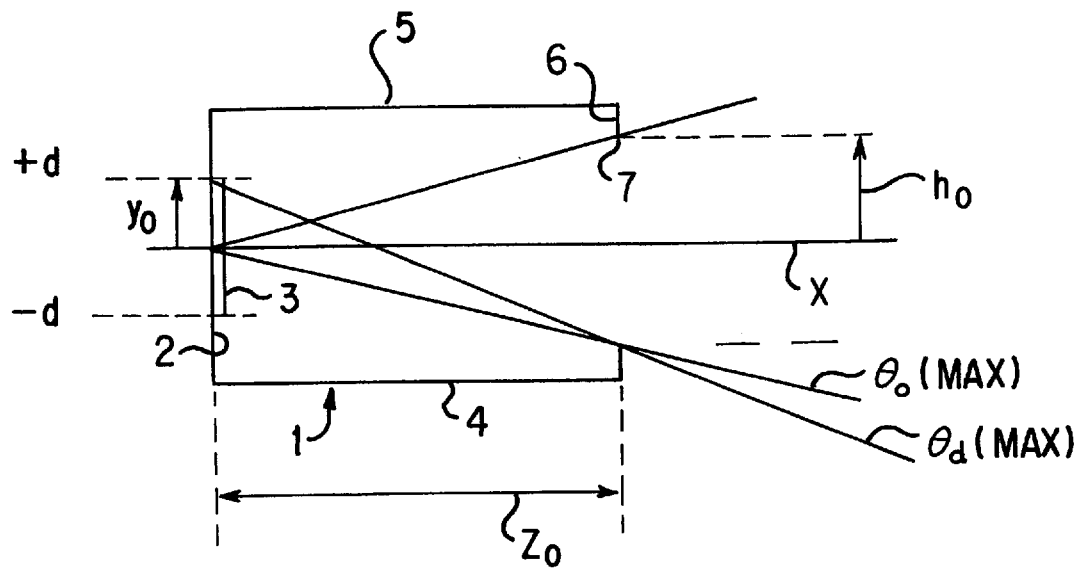
FIG. 1a is a diagrammatic sketch as mentioned above of a cold shield arrangement in accordance with prior art.

In the figures like parts are denoted by like reference numerals.

Figure 2:
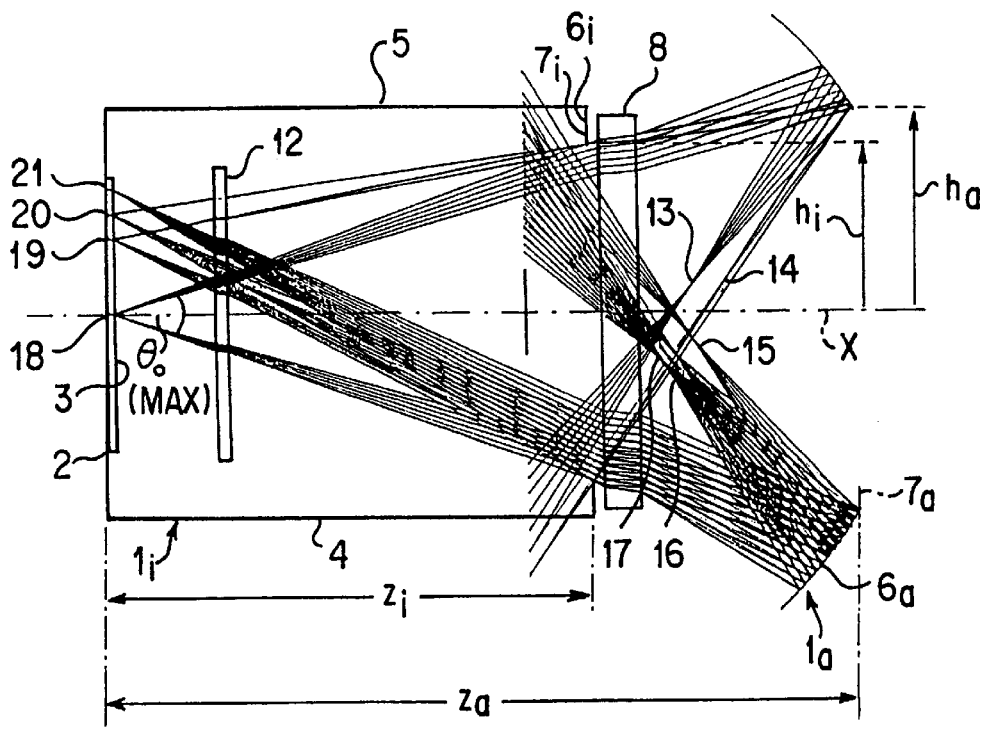
FIGS. 2 to 4 show three embodiments of the invention.

In FIG. 2 the internal cold shield is referenced $1_i$, which possesses a cold bottom surface 2, which bears a focal plane array or sheet-like detector element 3. The cold bottom surface 2 is adjoined by cold lateral walls 4 and 5, which may also constitute a cylindrical wall and which extend as far as an internal cold diaphragm $6_i$. The cold bottom surface with the adjoining lateral walls 4 and 5 and the internal cold diaphragm $6_i$ on the input ray side, having the aperture $7_i$ constitute the cooled internal cold shield $1_i$, which surrounds the detector element 3. The cooling of the internal cold shield $1_i$ is performed by a cooling device (not illustrated). In this respect it is possible for merely the bottom surface 2 to be cooled, but however the lateral walls 4 and 5 and the internal cold diaphragm $6_i$ may also be cooled.

The internal cold shield $1_i$ is located in a housing or Dewar vessel, which is connected with vacuum and is sealed by means of an input ray side infrared transparent window 8 (infrared window). In FIG. 2 only the infrared window 8 of the Dewar vessel (the terminating window thereof) is illustrated.

The internal cold shield $1_i$ depicted in FIG. 2 is placed behind an external cold shield $1a$, separated thermally from the internal cold shield $1_i$, for optically screening it from interfering infrared radiation, for instance in the form of an internally coated spherical or aspherical concave mirror and constitutes an external cold diaphragm $6_a$, which for example has an aperture (hole) $7_a$ placed centrally in relation to the optic axis. The aperture $7_a$ of the external cold diaphragm $6_a$ constitutes the exit pupil of the infrared optical system (infra red optics) on the input side.

The internal cold diaphragm $6_i$ of the internal cold shield $1_i$ functions as a baffle, and the distance $z_i$ between the image plane on the surface of the detector 3 and the internal cold diaphragm $6_i$ with the aperture $7_i$ can be minimized in accordance with the above mentioned rules of dimensioning, i. e. substantially shortened (see the above mentioned equation (6)), it being ensured that there is no vignetting at the external and internal cold diaphragms.

In the interior of the internal cold shield $1_i$ there is an optical filter 12, which is placed directly in front of the detector element 3. The filter may however be omitted. Such cold filters are known in infrared technology.

In accordance with the invention the external cold shield $1_a$ is so designed and so arranged opposite to the internal cold shield $1_i$ that the caustic focal points 13 to 17 of the ray sheaves, which come from the image points 18 to 21 of the image plane and are reflected through the infrared window 8 into the internal cold shield $1_i$, are just in front of but not on the surface of the infrared window 8. In the case of the radiation detector device in accordance with the invention the parameters are selected in the example as follows:

$k_a=2.0$ $k_i=z_i/2h_i=1.5$ $z_a=60$ mm $z_i=40$ mm d=10 mm

The radius of curvature of the external cold diaphragm $6_a$ may be optimized by means of known optical calculation method. As in the design in accordance with FIG. 2 it has a value of 27.5 mm.

Figure 3:
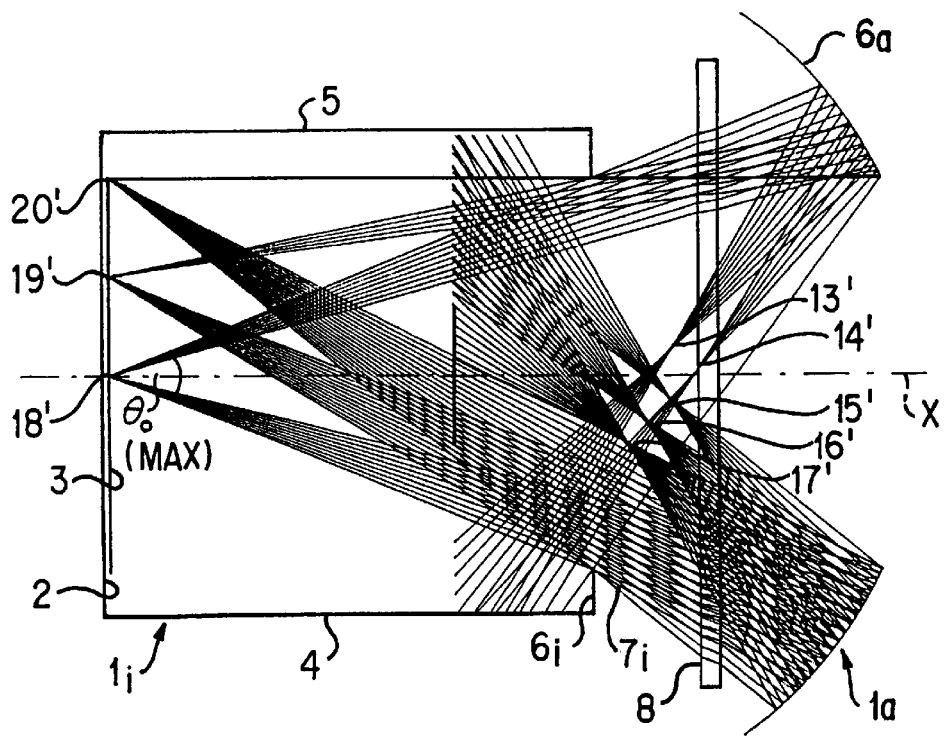

FIG. 3 shows a further embodiment of the invention of an infrared radiation detector arrangement provided by the invention and in accordance with FIG. 2, wherein the only detector surface of the detector element 3 and the internal cold diaphragm $6_i$ (as its aperture $7_i$) are indicated. Reference 8 indicates the infrared window and reference $6_a$ the external cold diaphragm. The modified parameters are selected in the case of this embodiment as follows:

$k_a=2.0$ $k_i=z_i/2h_i=1.25$ $z_a=40$ mm $z_i=25$ mm $d=10$ mm

Therefore, $Z_i$ is approximately 25 mm to 40 mm, $Z_a$ is approximately 40 mm to 60 mm, and $k_i$ is approximately 1.25 to 1.50.

In the case of this embodiment the caustic focal points 13' to 17' of the ray sheaves, which come from the image points 18' to 20', are between the infrared window 8 and the internal cold diaphragm 6.

In all embodiments, as is the case with the prior art, the maximum of the ray angle $\theta_0$ of the central image point 18 or, respectively, 18' is referenced $\theta_{0(max)}$. This corresponds to an optical aperture $(k_{opt})$ of $\frac{1}{2}\cot(\theta_{d(max)})$. The maximum ray angle $\theta_{0(max)}$ is 30°. This corresponds to an optical aperture of approximately 0.8. In this respect however in accordance with the invention the internal cold shield $1_i$ has the advantage over the prior art that its length $z_i$ is reduced by a factor of up to 2.

In the prior art (FIG. 1a) the minimum axial length $z_0$ of the internal cold shield is equal to approximately 4d, if the maximum overall diameter of the detector element is 2d. For the same maximum overall diameter of the detector element the distance $z_i$ of the aperture $7_i$ of the internal cold diaphragm $6_i$ in the invention (FIG. 1b) is however only approximately 2d.

The internal cold shield may therefore be shortened, in accordance with the invention, to be about half the size in the prior art.

Figure 4:
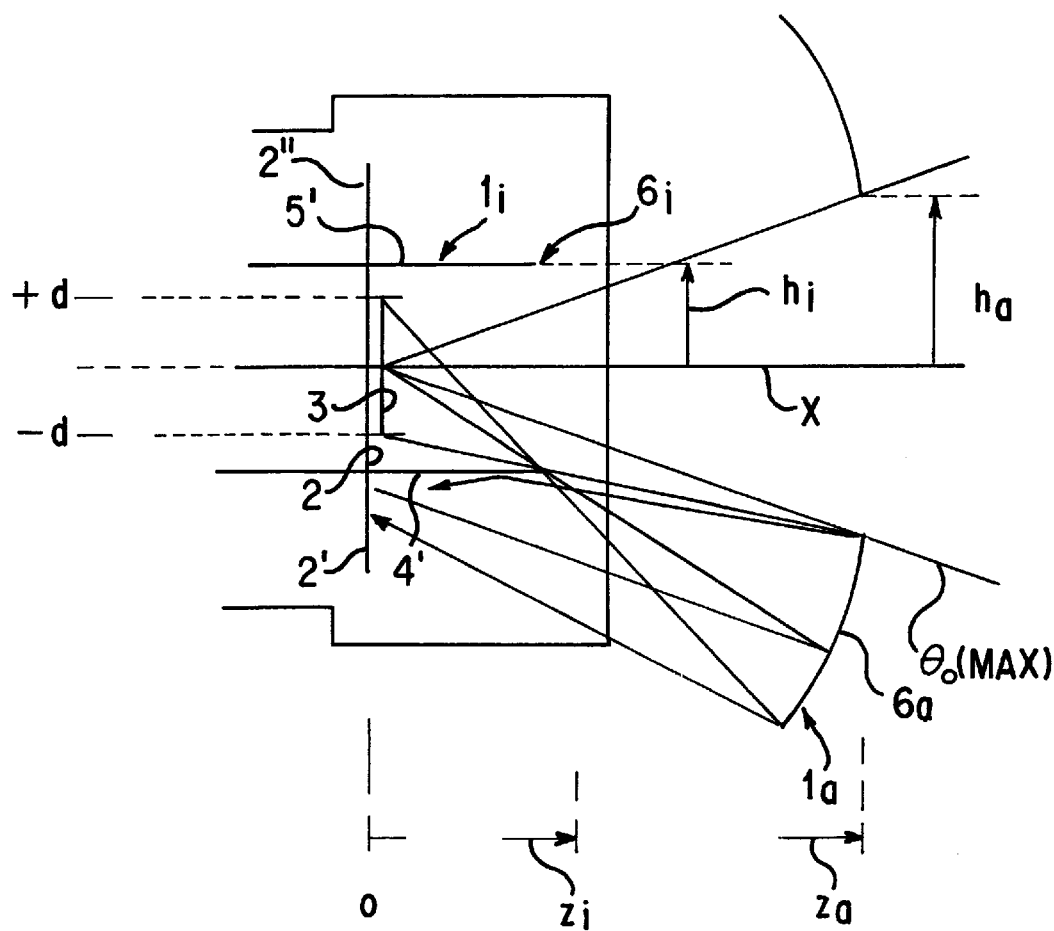

FIG. 4 shows a further embodiment of the invention, which is particularly suitable for wide aperture systems. If the maximum diameter of the detector is 2d, then in accordance with FIG. 4 the distance $z_i$ of the cold diaphragm aperture $7_i$ from the image plane is approximately 2d. In this respect the internal cold shield $1_i$ possesses a radial ring-like or collar-like bottom configuration with cooled lateral wall sections 4' and 5' and with cooled bottom sections 2' and 2", which are radially prolonged outward and by which the cooled bottom 2 of the internal cold shield is widened as a support for the detector element 3 past the lateral walls 4' and 5' extending in the axial direction. The internal cold diaphragm $6_i$ is in this case constituted by the free aperture section of the lateral wall sections 4' and 5'. The external cold diaphragm $6_a$ consists for example of a toroidal mirror surface. The lateral walls 4' and 5' can constitute an open cylinder, which at one end is closed by the bottom 2. The projecting bottom sections 2' and 2" may form a ring.

Figure 1B:
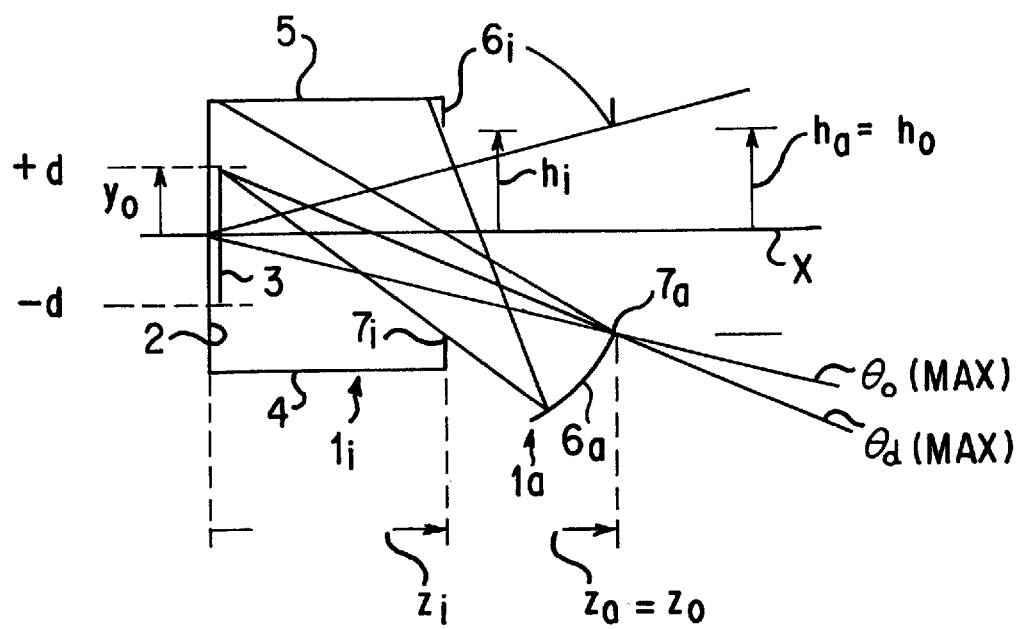

In all working embodiments, including the sketches of FIG. 1b serving to show the basic principle, the external cold shield $1_a$ is so designed and arranged opposite to the detector element 3 that the ray sheaves originating from image points of the optical image on the surface of the detector element and reflected by the external cold shield $1_a$ only impinge on the cooled surfaces of the internal cold shield $1_i$. Instead of the internal cold shield $1_i$ within a Dewar vessel (internal cold shield) it is furthermore possible to employ an externally mounted, cooled light trap, which is arranged clear of the position of the detector element and laterally offset and for example has a structure like the internal cold shield $1_i$ in accordance with FIGS. 1b through 4, which in this respect may be selected independently of the position of the detector element. On the other hand it may be advantageous to arrange the uncooled external cold shield $1_a$ together with the cooled external cold shield $1_i$ within a Dewar vessel, the external cold shield $1_a$ not being connected with the cooling device. One advantage is in this respect that the resulting caustic focal points do not play any role as regards the infrared window.

In all working embodiments it is possible to ensure that the ray sheaves coming from the image points on the detector element and which are reflected by the external cold shield $1_a$, do not fall on the detector element 3, but rather exclusively shine on the walls of the internal cold shield $1_i$, which are preferably all cooled, and any caustic focal points produced will preferably lie in the entry part, which is remote from the detector element 3, of the internal cold shield $1_i$ at a distance from the walls thereof.

The design of an optimum Dewar vessel is carried out in accordance with the invention as follows:

The external cold shield $1_a$ is to prevent the detector element from responding to radiation, which originates from the cooled Dewar vessel. The detector element 3 is consequently not to get any radiation, which is within the undesired spatial angle ranges, that is to say outside the external cold shield aperture ratio $k_a$. Putting it differently, in the undesired spatial angle ranges—extending over the external cold shield—the detector element 3 is to "see" only the cooled surfaces and essentially is not to "see" itself or parts of the Dewar vessel outside the internal cold shield $1_i$.

After determining the distance $z_a$ of the external cold diaphragm aperture from the image plane (detector surface) and the external cold diaphragm aperture ratio $k_a$, an attempt will be made to find the optimum minimum length $z_i$ of the internal cold shield $1_i$. A starting value for $z_i$ of $z_a/2$ is assumed and calculation of rays is performed to see whether it is possible to direct for all rays, which originate from the detector element and miss the hole $7a$ of the external cold shield $6a$, onto the cooled walls of the internal cold shield $1_i$. If in this respect there is then spurious radiation on the detector element 3, $z_i$ will be successively extended until there is no further spurious radiation on the detector element 3. In paraxial image forming conditions $z_i$ will become $z_a/2$ (see equation (6)).

In the case of design of the internal cold shield $1_i$ to be performed in this manner, the marginal condition must be fulfilled such that the Dewar vessel closure pad or, respectively, the infrared window 8 or parts thereof are not projected as an image onto the detector element 3 itself. For this purpose the position of the infrared window 8 must be optimized, as is explained with reference to FIGS. 1 through 4 and the equations (1) through (6).

In accordance with the invention an internal cold shield $1_i$ for a focal plane detector array 3 possesses an internal cold diaphragm operating as a baffle and an external cold shield $1_a$ and furthermore a physical diaphragm as an exit pupil of the infrared optics placed at the input end of the system. The external cold shield $1_a$ is so designed that the spatial angle ranges between the cold diaphragm aperture $7_i$ of the internal cold shield $1_i$ and the aperture $7_a$ of the external cold shield $1_a$ are practically completely reflected onto the cooled walls of the internal cold shield $1_i$. For this purpose the distance $z_i$ between the cold diaphragm $6_i$ of the internal cold shield $1_i$ with optimum minimum size (effective) internal cold shield aperture ratio $k_i$ and of the detector plane (image plane) is minimized, whereas the aperture ratio $k_a$ of the external cold diaphragm $6_a$ is maximized. No parts of the infrared window of the Dewar vessel are projected as an image onto detector. The caustic focal points of the rays coming from the detector element and reflected via the mirror coated internal surface of the external cold shield are within the range of the infrared window or preferably in the interior of the Dewar vessel. The mirror coated internal surface of the external cold shield $1_a$ may be spherical or aspherical. In this respect it is possible, for a plurality of staggered external cold shields to be present. The physical diaphragm is in this case constituted by the outermost cold shield which is furthest from the internal cold shield $1_i$. The other external cold shields and the internal cold diaphragm constitute baffles. The marginal parts of the internal cold shield are so dimensioned and operated (as regards reflectivity, operating temperature, mechanical dimensions) that no interfering effects on the detector 3 occur. In this respect it may be an advantage if between the detector element and the internal cold diaphragm $6_i$ of the internal cold shield $1_i$ an internal filter 12 (high, low or band pass filter) is arranged (FIG. 2). The infrared window 8 of the Dewar vessel may additionally or by itself be advantageously designed in the form of such an internal filter. The front side of the internal cold diaphragm (baffle) $6_i$ extends preferably as far as the internal side of the external outside wall of the Dewar vessel.

The aperture $7_i$ of the internal cold diaphragm $6_i$ may, in comparison with the aperture $7_a$ of the external cold shield $1_a$, be made with a low degree of accuracy, something which is an advantage, since the internal cold diaphragm $6_i$ is located within the Dewar vessel or vacuum vessel, which is sealed off from the outside. On the other hand it may be an advantage in the invention if the external cold shield $1_a$ is integrated with the external cold diaphragm $6_a$ in the Dewar vessel without its being connected with the cooling device for the internal cold shield $1_i$. If in accordance with the invention the aperture $7_a$ of the external cold shield $1a$ is placed at the position of the aperture 7 of the known cold shield in accordance with FIG. $1_a$, the Dewar vessel present for the known cold shield may be kept and employed substantially as it is. A conventional Dewar vessel for a cold shield in accordance with FIG. $1_a$ may therefore be utilized in the invention in order to be able to integrate the internal cold shield $1_i$, which is substantially shortened axially, and the external cold shield $1_a$ placed in front of it, in the Dewar vessel in any case present without substantial changes. It is in this manner that upgrading of existing Dewar vessels is possible using cold shields in accordance with FIG. $1_a$ in equipment in accordance with the invention while leaving substantially unchanged the apportionment of space present and with low costs for structural changes.

Although the above account has been limited to a few preferred embodiments of the invention, this has not been with the intention of limiting the invention thereto. In fact a man in the art will have available a large number of possibilities in order to implement the common inventive principle indicated by the individual calculations and in order to adapt to particular circumstances of an individual case. Thus for example a Dewar vessel with a cold diaphragm aperture $6_i$ may be so designed that by a simple change of the external cold shield $1_a$ of the overall system it can be operated with different external aperture ratios. The internal cold shield $1_i$ may be furthermore separately arranged outside the Dewar vessel.

We claim:

1. An infrared radiation detector device comprising:
  a cooled detector element (3);
  a first optical device ($1_i$) for screening off said detector element (3) from infrared radiation;
  said first optical device having a first radiation entry diaphragm ($6_i$) with a first aperture ($7_i$) and a cooled wall opposed to said first aperture and supporting said detector element (3) which forms an image plane on which an image is generated;
  a second optical device ($1_a$) placed in front of said first optical device ($1_i$) in direction of light propagation and thermally separated from said first optical device ($1_i$);
  said second optical device having a second radiation entry diaphragm ($6_a$) with a second aperture ($7_a$), characterized in that said second aperture ($7_a$) of said second radiation entry diaphragm ($6_a$) is an exit pupil of an infrared optic for producing said image;
  said first optical device ($1_i$) having a first radiation entry aperture ratio "$k_i$", of $$k_i = z_i/2h_i$$

wherein "$z_i$" denotes a first distance of said image plane from said first aperture ($7_i$) and "$h_i$" denotes a marginal height of said first aperture ($7_i$);
  said second optical device ($1_a$) having a second radiation entry aperture ratio "$k_a$" of $$k_a = z_a/2h_a$$

wherein "$z_a$" denotes a second distance of said image plane from said second aperture ($7_a$) and "$h_a$" denotes a marginal height of said second aperture ($7_a$); and the following conditions are met:

$$1k_{opt} = 2d/z_a + 1/k_a \text{ and}$$

$$\tfrac{1}{2}k_i = \tfrac{1}{2}k_a + (1/z_1 - 1/z_a)d$$

wherein "d" denotes one half of an overall diameter of said detector element (3), and $k_{opt}$ denotes the aperture ratio in a case of minimum optical aperture of said second optical device ($1_a$).

2. The device as claimed in claim 1, characterized in that in the case of a maximum radiation angle of the image center ($\theta_0$) of $\leq 30$ and in the case of a maximum overall diameter of 2d of the detector element (3), the first image distance ($z_i$) from said first diaphragm aperture ($7_i$) amounts to approximately d to 2d.

3. The device as claimed in claim 1, characterized in that said first image distance $z_i$ being selected to be $z_i > z_a/2$.

4. The device as claimed in claim 3, characterized in that an optical filter (12) is arranged in front of said detector element (3).

5. The device as claimed in claim 1, characterized in that said first aperture ratio $k_i = z_i/2h_i$ is approximately 1.25 to 1.50 and said second aperture ratio $k_a = z_a/2h_a$ is approximately 2.

6. The device as claimed in claim 1, characterized in that said first image distance $z_i$ is approximately 25 mm to 40 mm and said second image distance $z_a$ is approximately 40 mm to 60 mm.

7. The device as claimed in claim 1, characterized in that a maximum image height (2d) of said image plane on said detector element (3) is approximately 10 mm.

8. The device as claimed in claim 1, characterized in that caustic focal points (13–17, 13'–17') of rays extending from image points (18–21, 18'–20') on said image plane and reflected from said second optical device ($1_a$) are located between said first diaphragm aperture ($7_i$) and said second diaphragm aperture ($7_a$).

9. The device as claimed in claim 8, characterized by a filter (12) arranged in front of said detector element (3) behind said caustic focal points (13–17, 13'–17').

10. The device as claimed in claim 1, characterized in that said second optical device ($1_a$) is the outermost optical element of a plurality of further optical elements.

11. The device as claimed in claim 1, characterized in that said second optical device ($1_a$) constituting an exit pupil possesses a spherical or aspherical mirror coated internal surface.

12. The device as claimed in claim 1, characterized in that said second optical device ($1_a$) is curved and that a radius of curvature of said second optical device ($1_a$) is approximately 27.5 mm.

13. The device as claimed in claim 1, characterized in that said first image distance ($z_i$) is substantially equal to 2d, and said cooled wall having radially external wall sections (2', 2"), which extend outward beyond axial lateral walls (4', 5') of said first optical device ($1i$), said axial lateral walls forming a ring or collar with a radial diameter substantially equal to 2d.

14. An infrared radiation detector device comprising:
   a cooled detector element (3);
   a first optical device ($1_i$) for screening off said detector element (3) from infrared radiation;
   said first optical device having a first radiation entry diaphragm ($6_i$) with a first aperture ($7_i$) and a cooled wall opposed to said first aperture and separately arranged from said detector element (3) which forms an image plane on which an image is generated;
   a second optical device ($1_i$) placed in front of said first optical device ($1_i$) in direction of light propagation and thermally separated from said first optical device ($1_i$);
   said second optical device having a second radiation entry diaphragm ($6_a$) with a second aperture ($7_a$), characterized in that said second aperture ($7_a$) of said second radiation entry diaphragm ($6_a$) is an exit pupil of an infrared optic for producing said image;
   said first optical device ($1_i$) having a first radiation entry aperture ratio "$k_i$" of $$k_i = z_i / 2h_i$$

wherein "$z_i$" denotes a first distance of said image plane from said first aperture ($7_i$) and "$h_i$" denotes a marginal height of said first aperture ($7_i$);
   said second optical device ($1_a$) having a second radiation entry aperture ratio "$k_a$" of $$k_a = z_a / 2h_a$$

wherein "$z_a$" denotes a second distance of said image plane from said second aperture ($7_a$) and "$h_a$" denotes a marginal height of said second aperture ($7_a$); and the following conditions are met:

$$1/k_{opt} = 2d/z_a + 1/k_a \text{ and}$$

$$½k_i = ½k_a + (1/z_i - 1/z_a)d$$

wherein "d" denotes one half of an overall diameter of said detector element (3), and $k_{opt}$ denotes the aperture ratio in a case of minimum optical aperture of said second optical device ($1_a$); and that
   said second optical device ($1_a$) is arranged asymmetrically with respect to the optic axis (X) of said detector device.

* * * * *